US011094879B2

(12) United States Patent
Gotti et al.

(10) Patent No.: US 11,094,879 B2
(45) Date of Patent: Aug. 17, 2021

(54) STRUCTURES INCORPORATING AND METHODS OF FORMING METAL LINES INCLUDING CARBON

(71) Applicant: Micron Technology, Inc., Boise, ID (US)

(72) Inventors: Andrea Gotti, Boise, ID (US); F. Daniel Gealy, Kuna, ID (US); Innocenzo Tortorelli, Cernusco Sul Naviglio (IT); Enrico Varesi, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/121,261

(22) Filed: Sep. 4, 2018

(65) Prior Publication Data
US 2019/0019947 A1  Jan. 17, 2019

Related U.S. Application Data

(60) Continuation of application No. 15/473,338, filed on Mar. 29, 2017, now Pat. No. 10,153,428, which is a
(Continued)

(51) Int. Cl.
H01L 45/00 (2006.01)
H01L 27/24 (2006.01)
H01L 27/22 (2006.01)

(52) U.S. Cl.
CPC ............ *H01L 45/06* (2013.01); *H01L 27/224* (2013.01); *H01L 27/2427* (2013.01);
(Continued)

(58) Field of Classification Search
CPC ... H01L 45/06; H01L 45/1675; H01L 45/085; H01L 45/146; H01L 45/04; H01L 45/16;
(Continued)

(56) References Cited

U.S. PATENT DOCUMENTS 7,329,934 B1  2/2008  Koutny
7,601,566 B2  10/2009  Sakakura et al.
(Continued)

FOREIGN PATENT DOCUMENTS

CN      1449021 A    10/2003
CN    101399291 A     4/2009
(Continued)

OTHER PUBLICATIONS

Dubcek et al., "Characterization of grains in tungsten-carbon films," Nuclear Instruments and Methods in Physics Research B 200, 2003 (pp. 329-332).
(Continued)

*Primary Examiner* — Thao X Le
*Assistant Examiner* — Gardner W. S. Swan
(74) *Attorney, Agent, or Firm* — Holland & Hart LLP

(57) ABSTRACT

Disclosed technology relates generally to integrated circuits, and more particularly, to structures incorporating and methods of forming metal lines including tungsten and carbon, such as conductive lines for memory arrays. In one aspect, a memory device comprises a lower conductive line extending in a first direction and an upper conductive line extending in a second direction and crossing the lower conductive line, wherein at least one of the upper and lower conductive lines comprises tungsten and carbon. The memory device additionally comprises a memory cell stack interposed at an intersection between the upper and lower conductive lines. The memory cell stack includes a first active element over the lower conductive line and a second active element over the first active element, wherein one of the first and second active elements comprises a storage element and the other of the first and second active elements comprises a selector element. The memory cell stack further includes an electrode interposed between the at least one of the upper and
(Continued)

lower conductive lines and the closer of the first and second active elements.

19 Claims, 12 Drawing Sheets

Related U.S. Application Data division of application No. 14/594,038, filed on Jan. 9, 2015, now Pat. No. 9,634,245.

(52) U.S. Cl.
CPC .......... *H01L 27/2463* (2013.01); *H01L 45/04* (2013.01); *H01L 45/085* (2013.01); *H01L 45/1233* (2013.01); *H01L 45/1253* (2013.01); *H01L 45/141* (2013.01); *H01L 45/144* (2013.01); *H01L 45/146* (2013.01); *H01L 45/16* (2013.01); *H01L 45/1666* (2013.01); *H01L 45/1675* (2013.01); *H01L 2924/0002* (2013.01)

(58) Field of Classification Search
CPC .............. H01L 45/144; H01L 45/1233; H01L 45/1666; H01L 45/141; H01L 27/224; H01L 27/2427; H01L 27/2463; H01L 2924/0002
See application file for complete search history.

(56) References Cited

U.S. PATENT DOCUMENTS

| | | | |
|---|---|---|---|
| 7,956,406 B2 | 6/2011 | Yasuda | |
| 8,168,964 B2 | 5/2012 | Hiura et al. | |
| 8,551,885 B2 | 10/2013 | Chen et al. | |
| 8,557,643 B2 | 10/2013 | Han et al. | |
| 8,617,985 B2 | 12/2013 | Collins et al. | |
| 8,686,384 B2 | 4/2014 | Aoyama et al. | |
| 8,900,883 B1 | 12/2014 | Mani | |
| 8,963,115 B2 | 2/2015 | Murooka | |
| 8,964,491 B2 | 2/2015 | Schuette | |
| 9,054,295 B2 | 6/2015 | Gotti et al. | |
| 9,111,857 B2 | 8/2015 | Pellizzer et al. | |
| 9,142,774 B2 | 9/2015 | Yabuhara et al. | |
| 9,153,777 B2 | 10/2015 | Boniardi et al. | |
| 9,159,769 B2 | 10/2015 | Suguro | |
| 9,184,133 B2 | 11/2015 | Katagiri et al. | |
| 9,231,202 B2 | 1/2016 | Pangal et al. | |
| 9,287,498 B2 | 3/2016 | Kau | |
| 9,691,981 B2 | 6/2017 | Sills et al. | |
| 2007/0087616 A1 | 4/2007 | Sakakura et al. | |
| 2007/0159868 A1* | 7/2007 | Sugita ................ G11C 13/0007 365/100 |
| 2009/0078990 A1 | 3/2009 | Yasuda | |
| 2009/0201715 A1 | 8/2009 | Kreupl | |
| 2009/0283739 A1 | 11/2009 | Kiyotoshi | |
| 2010/0065163 A1* | 3/2010 | Branagan ................ C22C 1/02 148/561 |
| 2010/0244114 A1 | 9/2010 | Konno et al. | |
| 2010/0248431 A1 | 9/2010 | Nishitani et al. | |
| 2012/0199807 A1 | 8/2012 | Goswami | |
| 2013/0048935 A1 | 2/2013 | Gotti et al. | |
| 2013/0062587 A1* | 3/2013 | Lee ........................ H01L 45/08 257/4 |
| 2013/0153848 A1 | 6/2013 | Park et al. | |
| 2013/0170281 A1 | 7/2013 | Song et al. | |
| 2014/0246641 A1* | 9/2014 | Jameson, III ......... H01L 45/146 257/4 |
| 2014/0306174 A1 | 10/2014 | Murooka | |
| 2014/0353568 A1* | 12/2014 | Boniardi ............. H01L 45/1293 257/4 |
| 2015/0155287 A1 | 6/2015 | Heo et al. | |
| 2015/0270226 A1* | 9/2015 | Katagiri ............ H01L 23/53276 257/753 |
| 2015/0368535 A1* | 12/2015 | Dardona .................. C09K 5/14 428/368 |
| 2015/0372060 A1* | 12/2015 | Terai ................... H01L 27/2463 257/4 |
| 2017/0213959 A1* | 7/2017 | Gibson ............... H01L 27/2427 |

FOREIGN PATENT DOCUMENTS

| | | |
|---|---|---|
| CN | 103187526 A | 7/2013 |
| CN | 103460384 A | 12/2013 |
| JP | 2009081316 A | 4/2009 |
| JP | 2009283513 A | 12/2009 |
| JP | 2010225888 A | 10/2010 |
| KR | 20130077374 A | 7/2013 |
| WO | 2014116258 A1 | 7/2014 |

OTHER PUBLICATIONS

Dubcek et al., "Grazing incidence small angle X-ray scattering investigation of tungsten-carbon films produced by reactive magnetron sputtering," Surface and Coatings Technology, 2002 (pp. 218-221).

China National Intellectual Property Administration, "First Office Action," issued in connection with Chinese Patent Application No. 201680007436.0, dated Dec. 5, 2018 (14 pages).

KIPO, "Final Rejection," issued in connection with Korean Patent Application No. 10-2017-7018940, dated Mar. 14, 2019 (3 pages).

Japanese Patent Office, "Notice of Rejection," issued in connection with Japanese Patent Application No. 2017-535909, dated Nov. 6, 2018 (11 pages).

DiBattista, M. et al., "Using energy dispersive spectroscopy (EDS) to determine the resistance of FIB jumpers for circuit edit." ISTFA 2014: Conference Proceedings from the 40th International Symposium for Testing and Failure Analysis Nov. 9-13, 2014, pp. 278-283, ASM International.

ISA/EPO, International Search Report and Written Opinion of the International Searching Authority, Int'l. Appl. No. PCT/US2016/012492; dated Apr. 29, 2016, Korean Intellectual Property Office, Daejeon, Republic of Korea, 12 pgs.

Quesnel et al., "Tungsten and tungsten-carbon PVD multilayered structures as erosion-resistant coatings", Surface and Coatings Technology, 1993, 6 pgs. vol. 62, Elsevier Sequoia.

* cited by examiner

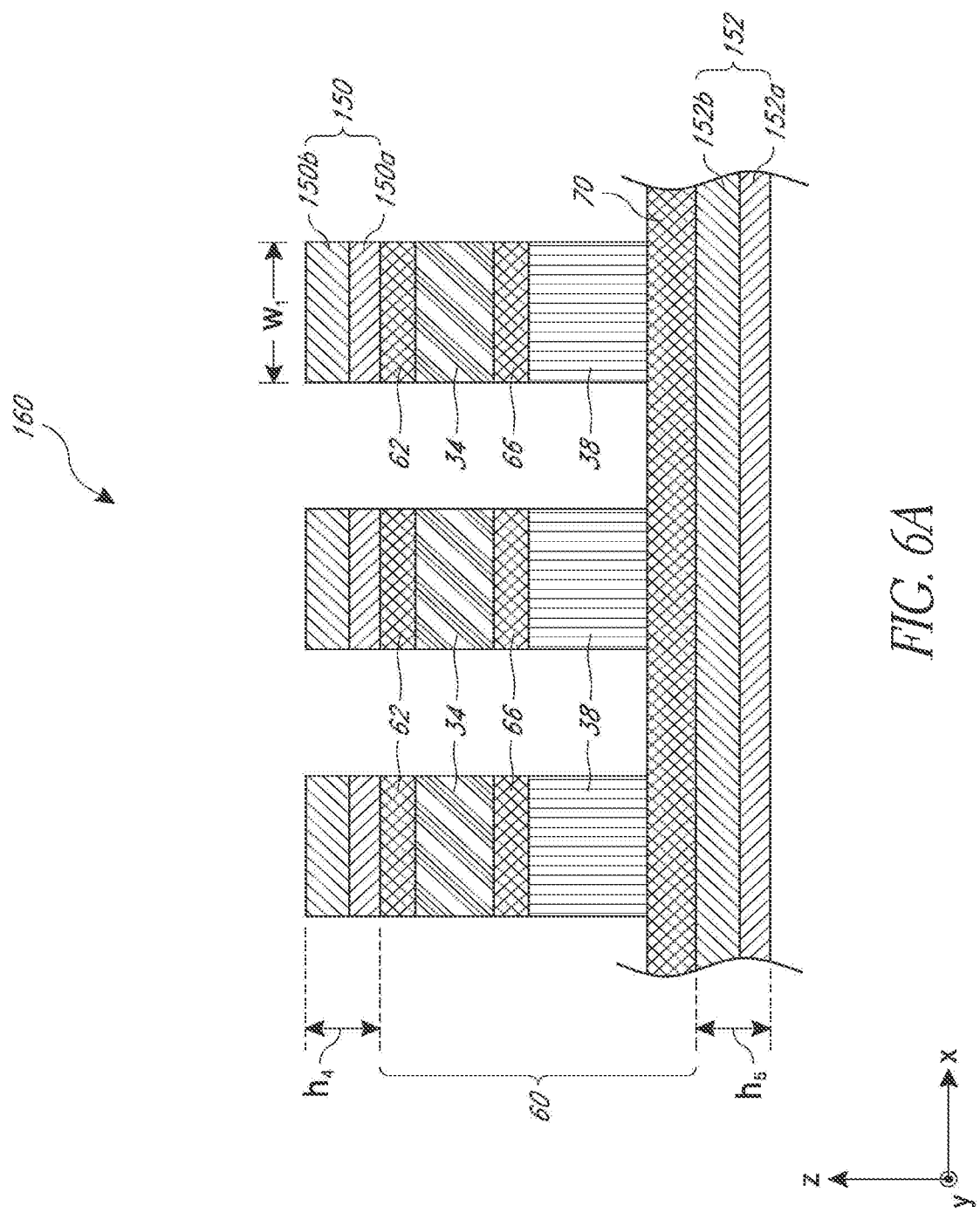

STRUCTURES INCORPORATING AND METHODS OF FORMING METAL LINES INCLUDING CARBON

CROSS REFERENCES

The present Application for Patent is a continuation of U.S. patent application Ser. No. 15/473,338 by Gotti et al., entitled "Structures Incorporating And Methods Of Forming Metal Lines Including Carbon," filed Mar. 29, 2017, which is a divisional of U.S. patent application Ser. No. 14/594,038 by Gotti et al., entitled "Structures Incorporating and Methods of Forming Metal Lines Including Carbon," filed Jan. 9, 2015, assigned to the assignee hereof, and each of which is expressly incorporated by reference in its entirety herein.

BACKGROUND

Field

Disclosed technology relates generally to integrated circuits, and more particularly to metal lines for memory arrays and methods for fabricating the same.

Description of the Related Art

Integrated circuits comprising deposited metal, such as tungsten metallization, may be found in a wide range of electronic devices, including computers, digital cameras, cellular telephones, personal digital assistants, etc. Metallization comprising tungsten can offer certain advantages, e.g., good conductivity and availability of dry etch chemistries. The metallization can form portions of the overall metallization scheme that are used, for example, to interconnect discrete devices, such as transistors or memory cells, with electrical input/output pins. As the metal interconnects are scaled in dimensions, there is an increasing need to reduce the electrical resistivity and surface roughness of the metal interconnects.

BRIEF DESCRIPTION OF THE DRAWINGS

FIG. 6A is a schematic cross-sectional depiction of a memory array including conductive lines comprising a metal and carbon according to some embodiments.

Figure 1:
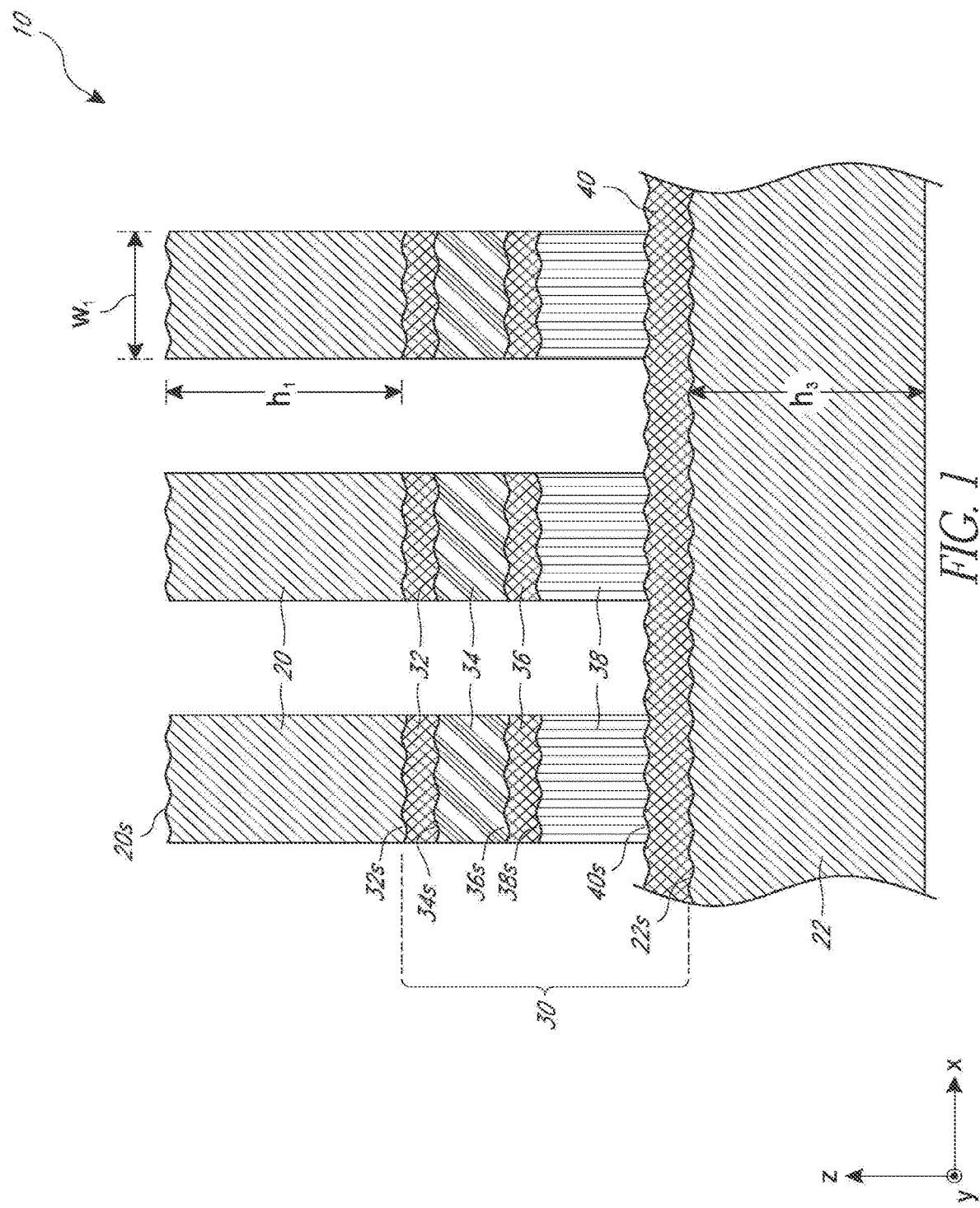
FIG. 1 is a schematic cross-sectional depiction of a memory array including conductive lines.

Features in the drawings are not necessarily drawn to scale and may extend in different directions from that illustrated. While various axes and directions are illustrated to facilitate the discussion herein, it will be appreciated that the features may extend in different directions.

DETAILED DESCRIPTION

Metallization structures, such as conductive lines of an integrated circuit (IC) provide electrical connections among discrete devices, such as transistors, resistors, or memory cells and external electrical inputs and outputs, such as I/O pins. As IC's continue to shrink in size, the metallization structures also continue to scale. As metallization structures, e.g., conductive lines, are scaled in dimensions, many challenges can arise. For example, etching increasingly smaller metallization structures poses challenges at least in part due to increasing aspect ratio of the metallization structures. In order to alleviate problems associated with high aspect ratios, the thicknesses of the metallization structures are often reduced in addition to the lateral dimensions. Such reduction in both lateral and vertical dimensions can lead to other related process integration challenges and/or degradation in electrical performance of the resulting devices. An example of process integration challenges includes minimizing the surface roughness of the conductive lines, whose values as a relative percentage of the conductive line dimensions increase with decreasing thickness. Reduction in thickness and/or increasing relative surface roughness can in turn increase the resistance of the conductive lines and/or cause problems for integration processes after forming the metal lines. In the following, embodiments that can alleviate challenges associated with scaling of the metallization structures are disclosed in the context of cross-point memory arrays. However, it will be appreciated that the concepts disclosed herein are generally applicable to other IC devices.

Generally, a cross-point memory array refers to a memory array having memory cells disposed and electrically connected at cross-junctions between a first set of conductive lines (e.g., word lines) and a second set of conductive lines (e.g., digit lines) overlapping and crossing the first set of conductive lines. The memory cells can change their memory state in response to an electrical signal, such as a voltage or a current pulse. Some memory cells, sometimes called the variable resistance memory cells, incorporate variable resistance materials whose electrical resistance can be changed by the electrical signals provided through the first and second conductive lines connected to the variable resistance materials. One category of variable resistance materials is phase change materials, such as but not limited to chalcogenide materials.

FIG. 1 depicts a cross-point memory array 10 having a plurality of memory cells 30. The memory cell 30 in FIG. 1 can include a variable resistance memory cell, e.g., a phase change memory cell, arranged in a stacked configuration between an upper conductive line 20 extending in a first direction (the y-direction in FIG. 1) and a lower conductive line 22 extending in a second direction that crosses with the first direction (the x-direction in FIG. 1). The upper and lower conductive lines 20 and 22 are conductive lines configured to carry electrical signals such as, for example, a voltage or a current pulse, between memory cells 30 and driver circuitry (not shown). The memory cell 30 includes a first active element 38, e.g., a selector element, and a second active element 34, e.g., a storage element, and in the illustrated embodiment these elements are separated by a middle electrode 36. The memory cell 30 additionally includes a lower electrode 40 between the first active element 38 and the lower conductive line 22 and an upper electrode 32 between the upper conductive line 20 and the second active element 34. In some embodiments, the lower electrode 40 forms a line which co-extends with the lower conductive line 22 in the x direction. In addition, while not shown in the two-dimensional depiction of FIG. 1, the first active element 38, the middle electrode 36, the second active element 34 and the upper electrode 32 form a column structure extending in the z-direction and are electrically confined in both the x-direction (as shown) and y-direction. The illustrated electrodes 32, 36 and 40 can include, e.g., carbon, and can also serve to prevent material interaction among the active materials and conductive lines and can be omitted for embodiments in which such interaction is not a concern.

As noted above, one of the challenges arising from scaling the upper and lower conductive lines 20 and 22 is minimizing the surfaces roughness of the conductive lines, which can be measured by, for example, root-mean-square (RMS) roughness as used in the industry. Still referring to FIG. 1, for typical conductive lines 20 and 22, e.g., comprising tungsten, having heights $h_1$ and $h_3$ between about 50 nm and about 70 nm, the corresponding surfaces 20s and 22s can have typical independent RMS roughness that can have values as high as between about 1 nm and about 5 nm, or between about 2% and about 10% of the heights of the conductive lines. These values of independent RMS roughness can pose various challenges described above as the widths of the lines, e.g., $w_1$ of the upper conductive line 20, are scaled below, e.g., about 50 nm. As used herein, an independent RMS roughness refers to an RMS roughness associated with a deposited material itself, independent of an RMS roughness that may be transferred from lower materials over which the material is deposited.

In addition, an RMS roughness of a surface 22s of the lower conductive line 22 can translate to structures formed on and over the lower conductive line 22, such that at least some of all of materials subsequently formed on and over the surface 22s can have surfaces whose RMS roughness values are comparable or exceeds the typical independent RMS roughness value associated with the rough surface 22s of the lower conductive line 22. Thus, the lower electrode 40, the first active element 38, the middle electrode 36, the second active element 34, the upper electrode 32 and the upper conductive line 20, respectively, can have corresponding surfaces 40s, 38s, 36s, 34s, 32s, and 20s, each of which can have RMS roughnesses whose values exceed the typical independent RMS roughness values of the surface 22s of the lower conductive line 22. Without being bound to any theory, rough surfaces of the electrodes 40, 36 and 32 and/or rough surfaces of the active elements 34, 38 can give rise to effects such as higher threshold voltage (VTH) distribution widths of the memory cells 30. In addition, the rough surfaces can increase the resistance of the conductive lines due to increased surface scattering of electrons. In addition, the rough surfaces can lead to incomplete removal of a previous material during etch or chemical mechanical polishing leading to what is known as "stringers" of the previous material, which can in turn lead to electrical shorting of the memory cells 30.

In the following, various embodiments relating to memory devices and methods of forming the memory devices are disclosed, which can advantageously include conductive lines comprising a metal and carbon that can provide smoother surfaces and/or lower resistance of the conductive lines. The inventors have found the various embodiments to substantially reduce the surface roughness and/or electrical resistivity of the conductive lines.

Figure 2A:
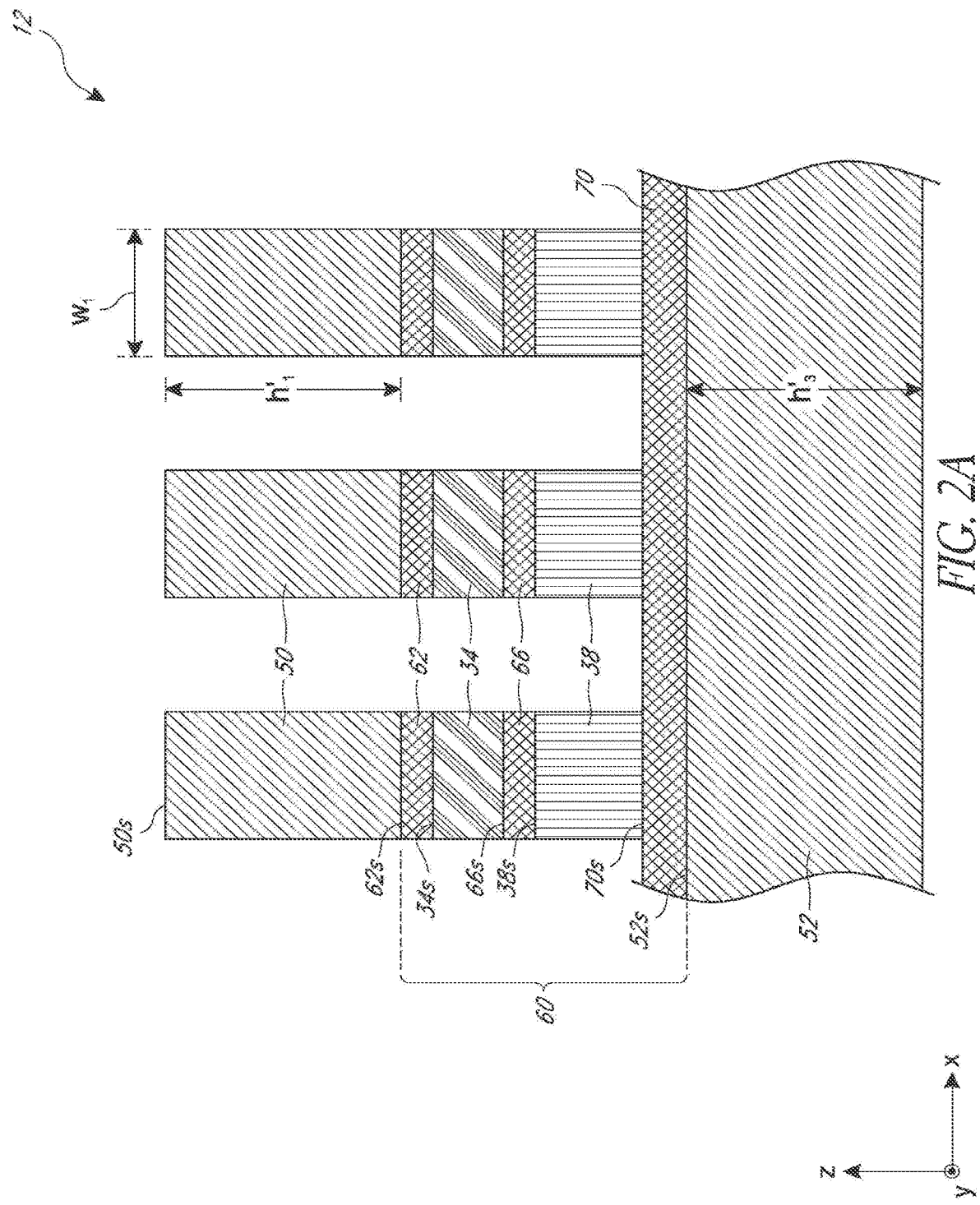
FIG. 2A is a schematic cross-sectional depiction of a memory array including conductive lines comprising a metal and carbon according to some embodiments.

FIG. 2A depicts a memory array 12 having at least one conductive line comprising a metal and carbon, according to some embodiments. The memory array 12 comprises a lower conductive line 52 extending in a x-direction and an upper conductive line 50 extending in an y-direction and crossing the lower conductive line 50. In some embodiments, one of both of the upper and lower conductive lines 50 and 52 do not contain carbon. The memory array 12 additionally comprises a memory cell 60 interposed at a crossing between the upper and lower conductive lines 50 and 52. The memory cell 60 includes a first active element 38 over the lower conductive line 52 and a second active element 34 over the first active element 38, wherein one of the first and second active elements 38 and 34 comprises a storage element and the other of the first and second active elements 38 and 34 comprises a selector element.

In addition, in the illustrated embodiment of FIG. 2A, the memory cell 60 additionally includes a lower electrode line 70 co-extending in the x-direction with the lower conductive line 52 and interposed between the lower conductive line 52 and the first active element 38, a middle electrode 66 interposed between the first and second active elements 38 and 34, and an upper electrode 62 interposed between the upper conductive line 50 and the second active element 34. The first active element 38, the middle electrode 66, the second active element 34 and the upper electrode 62 form a column structure extending in the z-direction and are electrically isolated in both the x-direction (as shown) and y-direction. It will be appreciated that while only one lower conductive line 52 and three upper conductive lines 50 are shown for clarity in the cross-sectional view of FIG. 2A, it will be understood that there can be any number of lower conductive lines 52 and upper conductive lines 50. State of the art memory arrays can have, e.g., between about 1 million (e.g., 1,024×1,024) and about 100 million (e.g., 10,240×10,240) memory cells.

Still referring to FIG. 2A, according to some embodiments, the at least one of the upper and/or lower conductive lines 50 and 52 can comprise a metallic material and carbon, e.g., an alloy of a metal and carbon. Examples of the metallic materials include elemental metals including, e.g., Al, Cu, Ni, Cr, Co, Ru, Rh, Pd, Ag, Pt, Au, Ir, Ta, and W; conductive metal nitrides including, e.g., TiN, TaN, and WN; conductive borides including TiB, TaB, WB; conductive metal silicides including tantalum silicides, tungsten silicides, nickel silicides, cobalt silicides and titanium silicides; and conductive metal oxides including $RuO_2$ and $InO_2$. In a particular embodiment, the metallic material is tungsten (W) and the at least one of the upper and/or lower conductive lines 50 and 52 has a tungsten concentration of between about 75% and about 99.9% and a carbon concentration of between about 0.1% and about 25% by atomic percentage, or between about 80 at. % and 99.5 at. % W and between about 0.5 at. % and 20 at. % C. More particularly, the conductive line that includes carbon can have between about 90 at. % and 99 at. % W and between about 1 at. % and 10 at. % C, even more particularly between about 95 at. % and 98 at. % W and between about 2 at. % and about 5 at. % C. The inventors have found that the concentration of carbon affects the surface roughness of the at least one of the upper and/or lower conductive lines 50 and 52 that contains carbon. In other embodiments, carbon in the relative amounts listed in the above ranges can be combined with conductive materials other than tungsten.

It will be appreciated that while metals deposited by chemical vapor deposition (CVD) or atomic layer deposition (ALD) can inherently have some residual carbon incorporated from precursors used to deposit the metals, the resulting concentration is generally less than the amount according to some embodiments, e.g., less than about 1 atomic %. Moreover, such vapor deposition processes often consume too much thermal budget, particularly for thermally sensitive variable resistance materials, such as chalocogenide materials. In addition, it will be appreciated that while some metals form stable carbides in the presence of carbon, many such carbides have stoichiometries represented by, e.g., MC, $M_2C$, $M_3C_2$ and $M_4C_3$, where M can be one of the metals described above, and have relatively high atomic carbon concentrations. For example, there are two known carbide phases of tungsten, namely $W_2C$ and WC, which have 33% and 50% of nominal carbon concentrations by atomic percentage. In some embodiments, conductive lines 50 and 52 comprising a metal, e.g., tungsten, and carbon can contain carbon concentration that is insufficient to form a stable carbide phase.

It will be appreciated that according to embodiments described herein, the surfaces 52s and/or 50s of the at least one of the lower and upper conductive lines 52 and 50 comprising a metallic material and carbon, respectively, has a roughness value that is substantially lower compared to the corresponding upper surfaces 22s and 20s in FIG. 1. In addition, when the lower conductive line 52 comprises the metallic material and the carbon, the relatively low surface roughness value of the conducive line 52 can result in relatively low surface roughness values of other surfaces 70s, 38s, 66s, 34s, 62s and 50s in the stack, corresponding to lower electrode 70, the selector element 38, the middle electrode 66, the storage element 34, the upper electrode 62 and the upper conductive line 50, respectively.

In some embodiments, the at least one of upper and/or lower conductive lines 50 and 52 comprising a metal and carbon, e.g., at a carbon content between about 0.5% and about 20% by atomic percentage, has a surface roughness having an RMS roughness value that is substantially less than those of conductive lines of a similar material but without carbon. By way of illustration, in some embodiments where conductive lines 50 and 52 including carbon have heights $h_1'$ and $h_3'$ less than or equal to about 100 nm, e.g., between about 50 nm and about 70 nm, a typical root-mean square (RMS) roughness can be less lower than or equal to about 1 nm, or even lower than or equal to about 0.5 nm. In some other embodiments where the conductive line including carbon has a height $h_1'$ or $h_3'$ less than about 100 nm, e.g., between about 50 nm and about 70 nm, a typical root-mean square (RMS) roughness can be less than or equal to about 2.5% of the line heights, or less than or equal to about 1.5% of the line heights, or even less than or equal to about 1% of the line heights. Various embodiments can have these values of surface roughness for the upper and/or lower conductive lines 50 and 52 having lateral widths similar to those of upper and/or lower conductive lines 20 and/or 22 of FIG. 1.

Still referring to FIG. 2A, examples of the second active element 34, which can be a variable resistance storage element, include a chalcogenide-based phase change storage element, a dielectric-based resistive random access memory (RRAM) storage element (e.g., NiO, $HfO_2$, $ZrO_2$, $Cu_2O$, $TaO_2$, $Ta_2O_5$, $TiO_2$, $SiO_2$, $Al_2O_3$), a conductive bridge random access memory (CBRAM) storage element (e.g., metal-doped chalcogenide), and/or a spin transfer torque random access memory (STT-RAM) storage element, among other types of storage elements.

Examples of the first active element 38, which can be a selector element, can include a two terminal device (e.g., a switch), such as a diode, an ovonic threshold switch (OTS), a tunnel junction, or a mixed ionic electronic conduction switch (MIEC), among other two terminal devices. Alternatively, examples of the selector element include a three terminal device (e.g., a switch), such as a field effect transistor (FET) or a bipolar junction transistor (BJT), among other switching elements.

Still referring to FIG. 2A, in some embodiments, one or both of the first and second active elements 38 and 34, which can be selector and storage elements, respectively, can comprise chalcogenide materials. When both storage and selector elements comprise chalcogenide materials, the storage element can comprise a chalcogenide material that can undergo a phase change that is nonvolatile at room temperature. On the other hand, the selector element can comprise a chalcogenide material that does not undergo a similar nonvolatile phase change.

In some embodiments, the storage element includes a chalcogenide material such as an alloy including at least two of the elements within the indium(In)-antimony(Sb)-tellurium(Te) (IST) alloy system, e.g., $In_2Sb_2Te_5$, $In_1Sb_2Te_4$, $In_1Sb_4Te_7$, etc., or an alloy including at least two of the elements within the germanium(Ge)-antimony(Sb)-tellurium(Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or an alloy including a mixture of an IST alloy and a GST alloy, which can includes the three or more of elements Ge, In, Sb and Te, among various other chalcogenide alloy systems.

In some embodiments, the selector element includes a chalcogenide material. A selector device having a chalcogenide material can sometimes be referred to as an Ovonic Threshold Switch (OTS). An OTS may include a chalcogenide composition including any one of the chalcogenide alloy systems described above for the storage element and, in addition, further include an element that can suppress crystallization, such as arsenic (As). Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Still referring to FIG. 2A, the upper, middle and lower electrodes 62, 66 and 70 can comprise materials that electrically connect the operational elements of the memory cell but prevent interactions and/or interdiffusion among adjacent materials. For example, a suitable electrode materials include one or more conductive and semiconductive materials such as, for example, carbon (C); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN; conductive borides including TiB, TaB, WB; conductive metal silicides including tantalum silicides, tungsten silicides, nickel silicides, cobalt silicides and titanium silicides; and conductive metal oxides including $RuO_2$ and $InO_2$.

In some embodiments, one or more of the upper, middle and lower electrodes 62, 66 and 70 can advantageously be formed using same or similar materials as described above for forming the at least one of the upper or lower conductive lines 50 and 52, which includes a metal, e.g. tungsten, and carbon. In such embodiments, the electrodes 62, 66 and 70 serve to prevent interactions/interdiffusion of adjacent materials, while also serving to improve surface roughness.

Figure 2B:
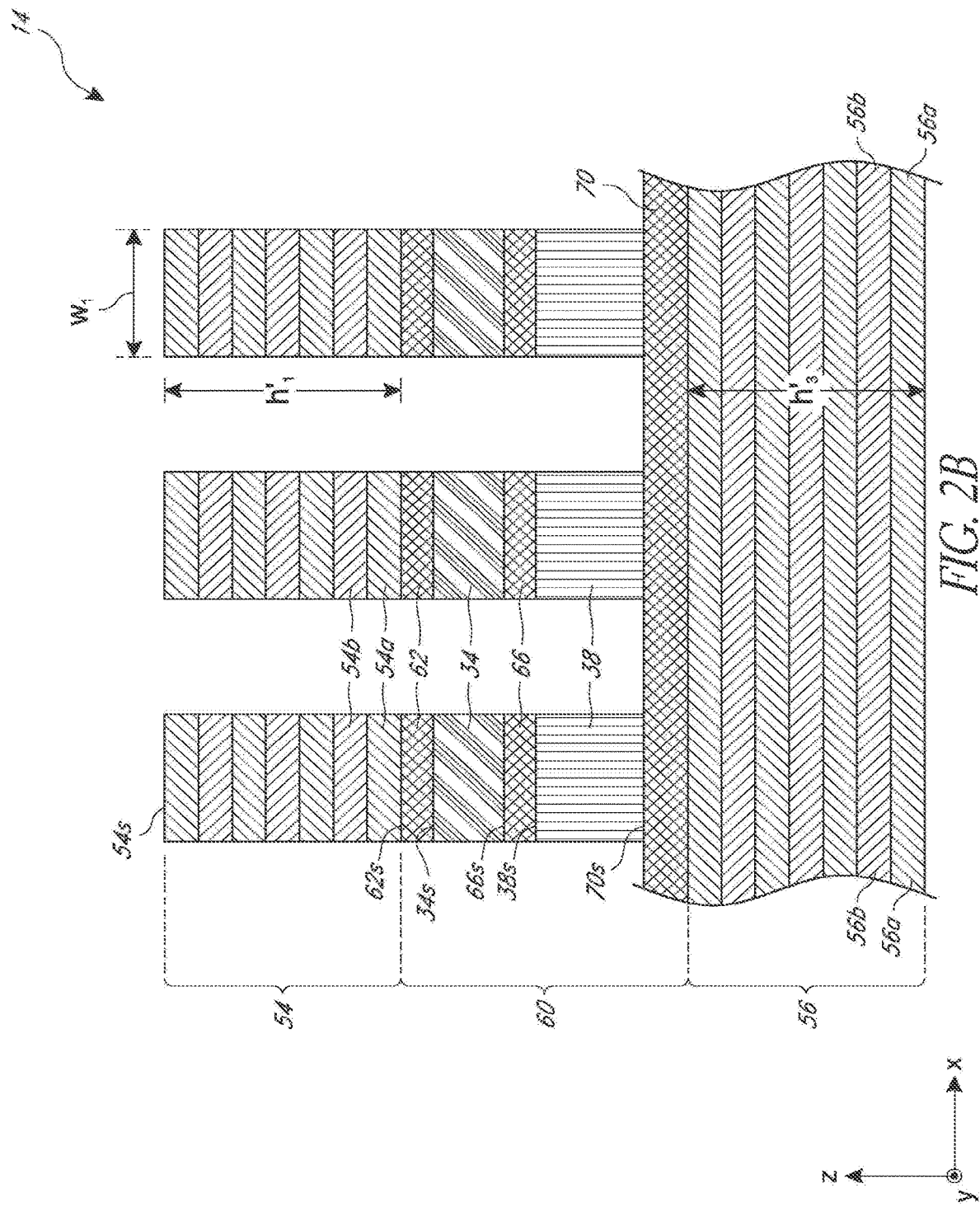
FIG. 2B is a schematic cross-sectional depiction of a memory array including conductive lines comprising a metal and carbon according to some embodiments.

FIG. 2B depicts a memory array 14 having at least one conductive line comprising a metal and carbon, according to some other embodiments. The memory array 14 comprises similar components as the memory array 12 of FIG. 2A except that at least one of a lower conductive line 56 and an upper conductive line 54 of the memory array 14 comprises a stack of layers, which can sometimes be referred to as a nanolaminate, wherein at least one of the layers of the stack comprises a metallic material and carbon. For example, the lower conductive line 56 and/or the upper conductive line 54 can comprise a stack comprising a mixture line 56a comprising a metallic material and carbon and a metal line 56b comprising a metallic material without carbon. Alternatively or additionally, the upper conductive line 54 can comprise a stack comprising a mixture line 54a (including carbon) and metal line 54b (not including carbon). The metal lines 56b and/or 54b can comprise any of the metallic materials described above with respect to the upper and/or lower conductive lines 50 and 52 of FIG. 2A, including elemental metals including, e.g., Al, Cu, Ni, Cr, Co, Ru, Rh, Pd, Ag, Pt, Au, Ir, Ta, and W; conductive metal nitrides including TiN, TaN, WN; conductive borides including TiB, TaB, WB; conductive metal silicides including tantalum silicides, tungsten silicides, nickel silicides, cobalt silicides and titanium silicides; and conductive metal oxides including $RuO_2$ and $InO_2$. The mixture lines 56a and/or 54a can comprise any of the metallic materials described above with respect to the upper and/or lower conductive lines 50 and 52 of FIG. 2A, and further comprise different amounts of carbon compared to metal lines 56b and 54b. In some embodiments, one of both of the metal lines 56b and/or 54b do not contain carbon. It will be appreciated that, while in the illustrated embodiment of FIG. 2B, the metal lines 54b and 56b are disposed over and on lowermost mixture lines 54a and 56a, respectively, the relative positions of the metal lines 54b and/or 56b can be interchanged with the corresponding mixture lines 54a and/or 56a, respectively. As used herein, "over" will be understood as relative to the underlying substrate. In some embodiments, forming the metal lines 54b and 56b without carbon over initial the mixture lines 54a and 56a can be advantageous in achieving a lower overall RMS roughness of the at least one of the upper and lower conductive lines 54 and 56 compared to embodiments where the mixture lines 54a and 56a are formed over initial metal lines 54b and 56b.

Still referring to FIG. 2B, the mixture lines 54a and 56a of the upper and lower conductive lines 54 and 56 can have material concentrations and physical properties, e.g., carbon concentration and surface roughness, similar to those of the at least one of the upper and lower conductive lines 50 and 52 described with respect to FIG. 2A.

In some embodiments, the at least one of the lower and upper conductive lines 56 and 54 comprises a stack of alternating layers comprising at least one mixture line comprising a metallic material and carbon, and at least one metal line comprising carbon and a metallic material without or with a different carbon content compared to the mixed lines. In the illustrated embodiment, the lower conductive line 56 comprises alternating metal lines 56b and mixture lines 56a, and the upper conductive line 54 comprises alternating metal lines 54b and mixture lines 54a. In some embodiments, the at least one of a lower and upper conductive lines 56 and 54 comprises a nanolaminate comprising a stack of alternating metal lines (56b, 54b) having a thickness between about 0.5 nm and about 3 nm, or between about 1 nm and about 2 nm, and mixture lines (56a, 54a) having a thickness between about 0.5 nm and about 3 nm, or between about 1 nm and about 2 nm.

In the illustrated embodiment of FIG. 2B, the stacks of the at least one of the lower and upper conductive lines 56 and 54 have metal lines 56b and 54b as topmost lines, which can be advantageous, in some embodiments, for forming certain structures thereon. In other embodiments, however, the at least one of the lower and upper conductive lines 56 and 54 have mixture lines 56a and 54a as topmost lines, which can be advantageous for forming certain other structures thereon.

It will be appreciated that embodiments modified from the illustrated embodiments of FIGS. 2A and 2B are possible. For example, while the embodiment in FIG. 2A has the lower electrode 70 configured as a line structure while the upper electrode 62 is configured as a structure laterally confined in both x and y directions, the opposite configuration is possible, where the lower electrode 70 is configured as a structure laterally confined in x and y directions and the upper electrode 62 is configured as a line structure. In other embodiments, both the upper and lower electrodes 62 and 70 can be confined in one or two lateral dimensions. In addition, the positions of the active elements 34 and 38 are interchangeable such that either of the active elements 34 and 38 can be a storage or a selector element. In yet other embodiments, a selector element may be omitted. In yet other embodiments, one or more of the upper, middle, and lower electrodes 62, 66 and 70 may be omitted.

In some embodiments, the conductive lines having an RMS roughness value less than about 2.5% of the height of the conductive lines can be achieved by controlling the nanostructure of the conductive lines. Without being bound to any theory, in some embodiments, the surface roughness can be correlated to the grain size and distribution, phases of the material present and/or impurities present. In the following embodiments, nanostructures of the conductive lines are described, to achieve at least some of the particular attributes discussed above, e.g., surface roughness.

Figure 3B:
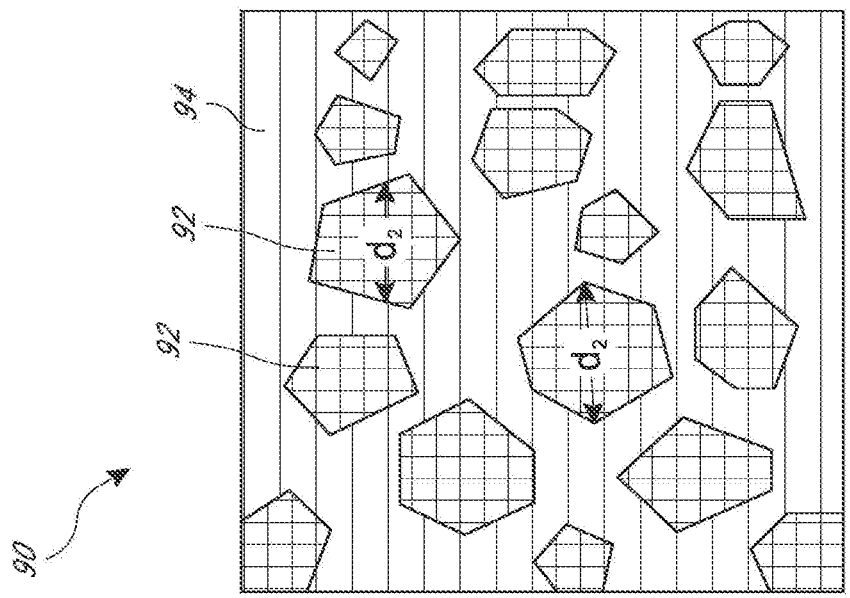
FIG. 3B is a schematic illustration of the microstructure of a conductive material comprising a metal and carbon according to some embodiments.
Figure 3A:
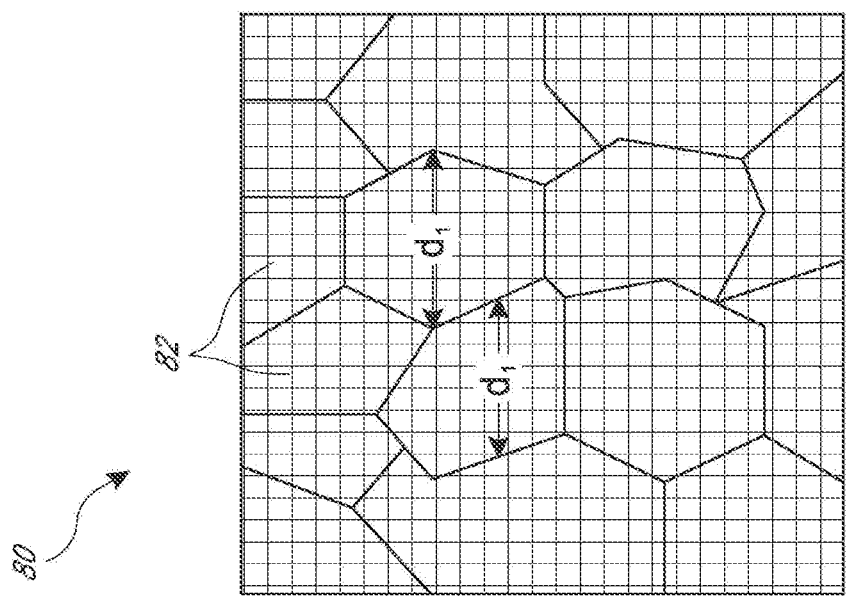
FIG. 3A is a schematic illustration of the microstructure of a conductive material comprising a metal.

FIG. 3A depicts a schematic nanostructure 80 of conductive lines comprising a metal, e.g., tungsten, but do not have significant amounts of carbon. As used herein, a significant amount of carbon refers to carbon content equal to or greater than about 0.5 atomic %, and more particularly greater than about 1 at. % carbon, as described above with respect to FIG. 2A. The nanostructure 80 can correspond to, for example, upper and/or lower conductive lines 20 and/or 22 of FIG. 1. The nanostructure 80 comprises metallic crystalline grains 82 having an average diameter $d_1$. The magnitude of $d_1$ can depend upon, among other things, the composition, the thickness, the surface, and the temperature associated with the deposited conductive material from which the conductive lines 20 and 22 are formed. In embodiments where the metal comprises tungsten, the crystalline grains 82 can comprise grains of at least one of two known solid crystalline phases: a lower resistivity alpha-phase having a body-centered cubic (bcc) structure and a higher resistivity beta-phase having a cubic (A15) structure. The former is understood to be an equilibrium phase.

FIG. 3B depicts a schematic nanostructure 90 corresponding to conductive lines having an alloy comprising a metal, e.g., tungsten, and further comprising carbon, e.g., between about 0.5% and about 25% by atomic percentage, according to some embodiments. The nanostructure 90 can correspond to, for example, upper and/or lower conductive lines of FIGS. 2A and 2B. The nanostructure 90 comprises crystalline grains 92 having an average diameter $d_2$ smaller than $d_1$ of the grains 82 of the nanostructure 80 (FIG. 3A) corresponding to a metal, e.g., tungsten, that does not have significant amounts of carbon. Similar with respect to the nanostructure 80 of FIG. 3A, the magnitude of $d_2$ can depend upon, among other things, the composition, the thickness, the surface, and the temperature associated with the deposited conductive material from which the conductive lines are formed. Also similar to the nanostructure 80 of FIG. 3A, in embodiments where the alloy comprises tungsten, the crystalline grains 92 can comprise grains of one of an alpha-phase and a beta-phase of tungsten or a carbide phase.

Still referring to FIG. 3B, the nanostructure 90 further comprises a matrix 94 according to some embodiments. In some embodiments, the matrix 94 can be at least partially amorphous. In some other embodiments, the matrix can have a carbon content greater than a carbon content of the crystalline grains 92. Without being bound to any theory, the presence of carbon can suppress nucleation and/or growth of the crystalline grains 92.

Figure 4:
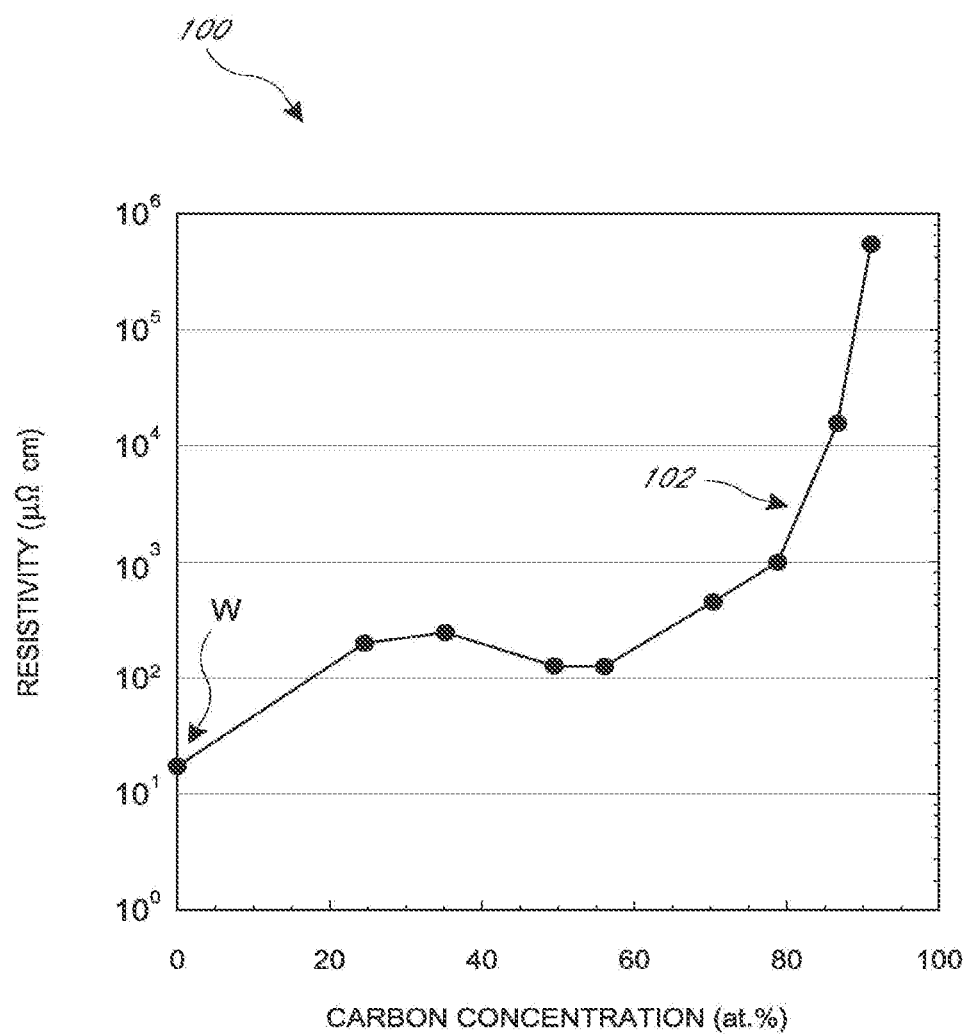
FIG. 4 is a graph showing measured resistivity of a conductive material comprising tungsten and carbon as a function of carbon concentration according to some embodiments.

FIG. 4 is a graph 100 showing a trend 102 of measured resistivity of conductive lines comprising tungsten and carbon, similar to conductive materials described above with respect to FIGS. 2A and 2B, according to some embodiments. In graph 102, the x-axis represents the carbon concentration in atomic percentage and y-axis represents the resistivity. The trend 102 indicates that the resistivity of the conductive lines generally increases with increasing carbon concentration. As illustrated, within carbon content between about 0.5% and about 25% by atomic percentage, the resulting resistivity remains within less than about 10× of a comparable conductive line not having a substantial amount of carbon, e.g., 0%.

Figure 5:
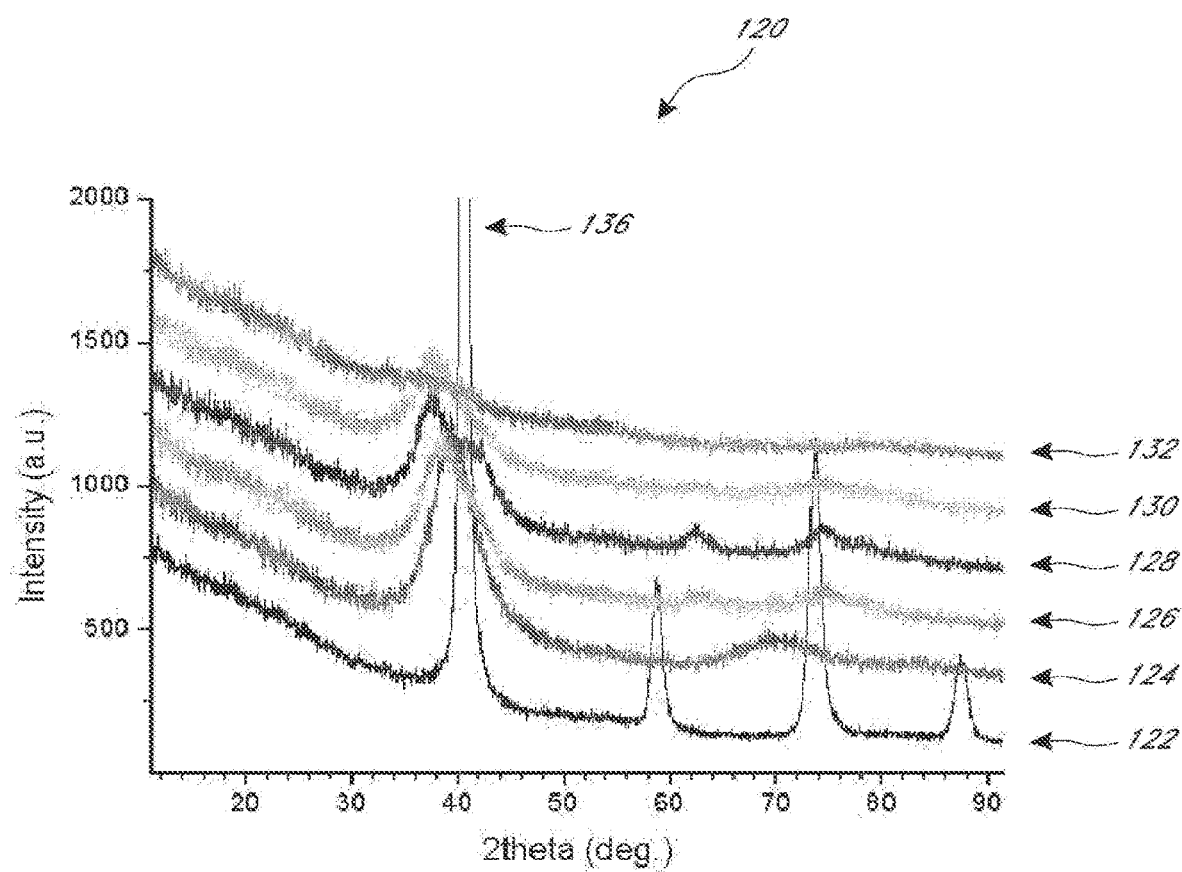
FIG. 5 is a graph showing measured x-ray diffraction patterns of various conductive materials comprising tungsten and varying amounts of carbon according to various embodiments.

FIG. 5 is a graph 120 illustrating measured x-ray diffraction patterns of various conductive materials comprising tungsten and varying amounts of carbon according to some embodiments. The x-ray diffraction patterns 122, 124, 126, 128 and 130 correspond to conductive materials having about 0%, about 20%, about 45%, about 50% and about 55% by atomic concentrations, respectively, after being annealed at 450° C. in nitrogen flow ambient for 30 minutes. Without being bound to any theory, the diffraction peak 136 at 2 theta of about 40.3° of the x-ray diffraction pattern 122 is generally attributed to the (110) plane of the α-phase tungsten. In addition, without being bound to any theory, higher widths of the x-ray peaks near, for example, 2 theta of about 40.3° of the x-ray diffraction patterns 124, 126, 128 and 130 compared to the x-ray diffraction pattern 122 may indicate smaller average grain sizes of the nanostructures in conductive materials corresponding to the diffraction patterns 124, 126, 128 and 130, compared to the average grain size of the conductive material corresponding to the diffraction pattern 122. In addition, without being bound to any theory, decreasing intensities of the x-ray peaks relative to adjacent backgrounds with increasing atomic concentration of carbon, as indicated by the x-ray peaks near, for example, 2 theta of about 40.3° of the x-ray diffraction patterns 122, 124, 126, 128 and 130 may indicate an increasing fraction of an amorphous material of the conductive materials corresponding to the x-ray diffraction patterns 122, 124, 126, 128 and 130.

FIG. 6A depicts a memory array 160 having at least one conductive line comprising a stack comprising a metallic conductive line and a conductive carbon-containing line, according to some other embodiments. The memory array 160 comprises similar components as the memory array 12 of FIG. 2A except that at least one of a lower conductive line 152 and an upper conductive line 150 of the memory array 160 comprises a stack comprising a metallic conductive line (152a and/or 150a) and a conductive carbon-containing line (152b and/or 150b), wherein the conductive carbon-containing line (152b and/or 150b) has an electrical resistivity in a direction of line extension that is lower than an electrical resistivity of amorphous carbon. At least one of the metallic conductive lines 152a and 150a comprises one of the metallic materials described above with respect to with respect to the upper and/or lower conductive lines 50 and 52 of FIG. 2A including elemental metals including, e.g., Al, Cu, Ni, Cr, Co, Ru, Rh, Pd, Ag, Pt, Au, Ir, Ta, and W; conductive borides including TiB, TaB, WB; conductive metal silicides including tantalum silicides, tungsten silicides, nickel silicides, cobalt silicides and titanium silicides; and conductive metal oxides including $RuO_2$ and $InO_2$. Additionally, at least one of the conductive carbon-containing lines 152b and 150b comprises a carbon material having an electrical resistivity lower than amorphous carbon in the direction of line extension directions (i.e., x and y directions for lower and upper conductive lines 152 and 150, respectively). At least one of the conductive carbon-containing lines 152b and 150b comprises a different carbon amount compared to the metallic conductive lines 152a and 150a. In some embodiments, one of both of metallic conductive lines 152a and 150a do not contain carbon.

In some embodiments, the at least one of conductive carbon-containing lines 152b and 150b comprise one or more sheets, sometimes referred to as monolayers, of graphene extending generally in the x-y plane in FIG. 6A. As used herein, graphene refers to a 2-dimensional, crystalline allotrope of carbon packed in a regular $sp^2$-bonded hexagonal pattern. A sheet of graphene can be described as a one-atom thick layer of graphite. In some embodiments, the at least one of the conductive carbon-containing lines 152b and 150b comprises between 1 and 20 sheets of graphene, or between 1 and 10 sheets of graphene, or between 1 and 5 sheets of graphene, between upper and lower surfaces of the at least one of the conductive carbon-containing lines 152b and 150b. At least one sheet of graphene, at least five sheets of graphene, or at least ten sheets of graphene form continuous sheet(s) of graphene along the lengthwise direction of the at least one of conductive carbon-containing lines 152b and 150b for lengths longer than about 100 nm, longer than about 500 nm, longer than about 1 µm, or across an entire length of the at least one of conductive carbon-containing lines 152b and 150b, according to various embodiments. Such cross-sectional segments can be imaged using, for example, cross-sectional transmission electron microscopy. In various embodiments, the at least one of the conductive carbon-containing lines 152b and 150b can have widths less than about 50 nm, less than about 20 nm, or less than about 10 nm.

In some embodiments, the sheets of graphene are stacked to form the at least one of the conductive carbon-containing lines 152b and 150b having a thickness between about 0.3 nm and about 20 nm, more particularly between about 0.3 nm and about 10 nm, and in certain embodiments between about 0.3 nm and about 5 nm. In some embodiments, the at least one of the metallic conductive lines 152a and 150a has thickness between about 1 nm and about 20 nm, or between about 1 nm and about 10 nm, or between about 1 nm and about 5 nm. In some embodiments, the at least one of the lower and upper conductive lines 152 and 150 has a combined thickness ($h_5$ and $h_4$ in FIG. 6A) between about 1.3 nm and about 40 nm, or between about 1.3 nm and 20 nm, or between about 1.3 nm and about 10 nm. In various embodiments, the various thicknesses of the various layers described herein may be particularly chosen where the widths (e.g., $w_1$) of the various layers are less than about 50 nm, less than about 20 nm, or less than about 10 nm.

Accordingly, the thickness of the conductive lines can be greatly reduced, which simplifies processing due to reduced aspect ratios. Whereas for a line width of about 50 nm (e.g., for a 50 nm technology node), tungsten thickness of about 50 nm to 70 nm might be employed for suitable conductivity, a bilayer with thicknesses of about 5 nm tungsten and 5 nm graphene may provide substantially equivalent conductivity. Thus, an aspect ratio less than 1 can be achieved.

Figure 6B:
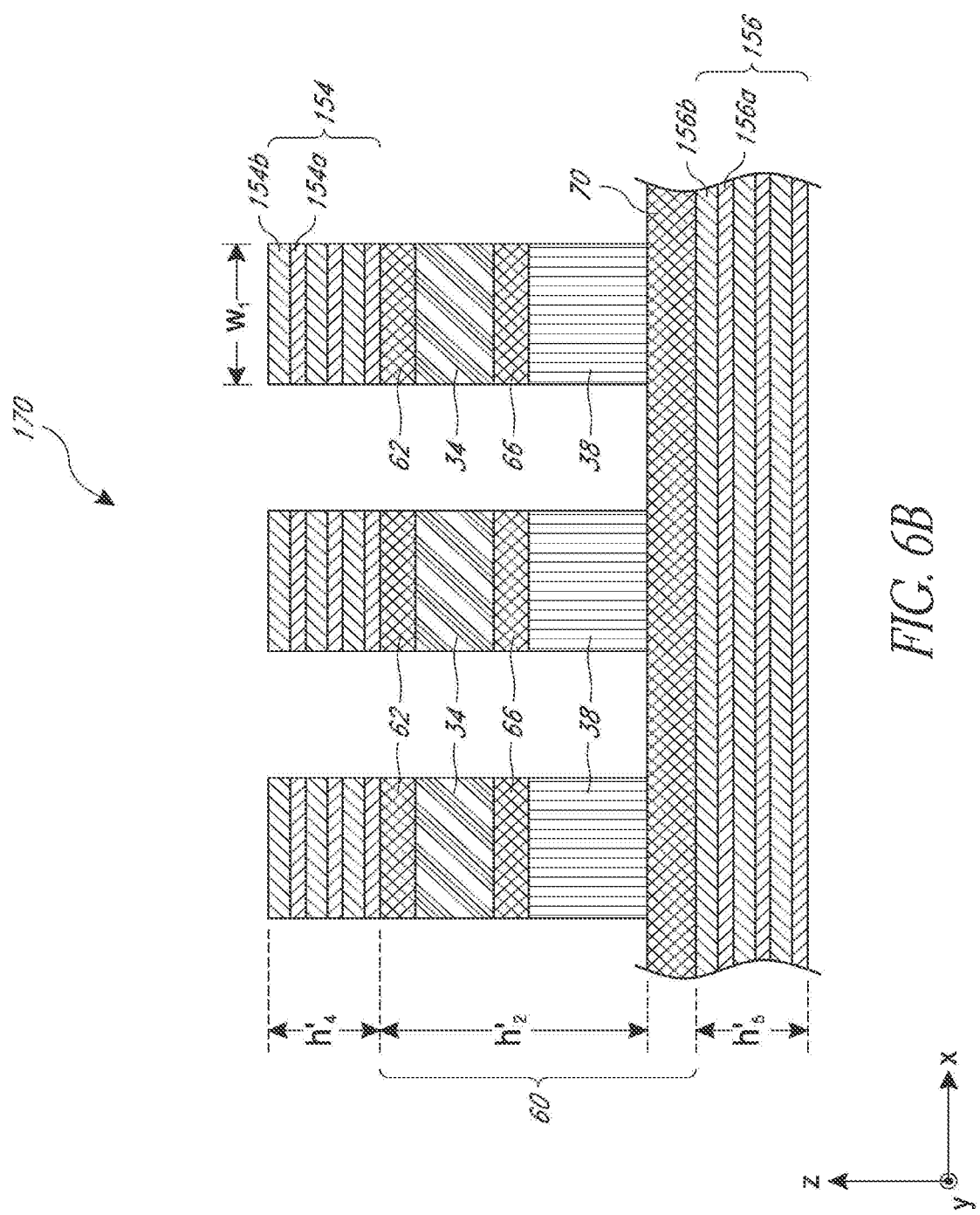
FIG. 6B is a schematic cross-sectional depiction of a memory array including conductive lines comprising a metal and carbon according to some embodiments.

Referring now to FIG. 6B, a memory array 170 according to some other embodiments can have at least one of lower and upper conductive lines 156 and 154 which comprises a stack of alternating layers comprising at least one conductive carbon-containing line and at least one metallic conductive line. In the illustrated embodiment, the lower conductive line 156 comprises alternating metallic conductive lines 156a and conductive carbon-containing lines 156b, and the upper conductive line 154 comprises alternating metallic conductive lines 154a and carbon-containing lines 154b. In some embodiments, the at least one of conductive carbon-containing lines 156b and 154b comprise one or more sheets, sometimes referred to as monolayers, of graphene extending generally in the x-y plane in FIG. 6B. In some embodiments, the at least one of the lower and upper conductive lines 156 and 154 comprises a nanolaminate comprising a stack of alternating metallic conductive lines (156a, 154a) having a thickness between about 0.5 nm and about 3 nm, more particularly between about 1 nm and about 2 nm, and conductive carbon-containing lines (156b, 154b) having a thickness between about 0.3 nm and about 3 nm, more particularly between about 1 nm and about 2 nm. In some embodiments, the at least one of lower and upper conductive lines 156 and 154 has a combined thickness ($h_5'$ and $h_4'$ in FIG. 6B) between about 0.8 nm and about 40 nm, more particularly between about 0.8 nm and about 20 nm, and in certain embodiments between about 0.8 nm and about 10 nm. In various embodiments described herein, the various thicknesses of the conductive lines, carbon-containing lines and metallic conductive lines described herein may be particularly chosen where the widths (e.g., $w_1$) of the various layers are less than about 50 nm, more particularly less than about 20 nm, and in some embodiments less than about 10 nm, such that a particular resistance of the conductive lines may be achieved.

It will be appreciated that, in some embodiments, by having at least one carbon-containing line (152b and/or 150b for memory array 160 in FIG. 6A and 156b and/or 154b for memory array 170 in FIG. 6B), the at least one of the lower and upper conductive lines 150 and 152 of FIG. 6A and the at least one of the lower and upper conductive lines 156 and 154 of FIG. 6B can have substantially smaller heights ($h_5$ and $h_4$ in FIG. 6A and $h_5'$ and $h_4'$ in FIG. 6B, respectively) compared to heights ($h_3$ and $h_1$) of the corresponding one of the lower and upper conductive lines 22 and 20 of the memory array 10 of FIG. 1. The lower heights for similar resistances can be enabled at least in part by low electrical resistivity of graphene, and can facilitate processing with lower aspect ratios for closely spaced features.

It will be appreciated that, in the illustrated embodiments of FIGS. 6A and 6B, the conductive carbon-containing lines 152b and 150b, and 156b and 154b, are formed on the corresponding metallic conductive lines 152a and 150a, and 156a and 154a, which can be advantageous for choosing a suitable surface of the metallic conductive material on which the carbon-containing material, e.g., graphene, is formed. For example, having a suitable surface, e.g., tungsten, as a depositing surface can be advantageous for forming the graphene. However, in other embodiments, the relative positions of the metallic conductive lines 152a and 150a (156a and 154a) can be interchanged with the corresponding conductive carbon-containing lines 152b and 150b (156b and 154b), respectively.

It will be further appreciated that, in the illustrated embodiments of FIGS. 6A and 6B, the conductive carbon-containing lines 152b and 150b (156b and 154b) are formed as topmost lines, which can be advantageous for forming certain structures thereon.

Conversely, for example, having the metallic conductive lines 152a and 150a (156a and 154a) as topmost lines can be advantageous in providing an oxidation barrier for the underlying carbon-containing material, e.g., graphene.

Referring to FIGS. 6A and 6B, in embodiments where the at least one carbon-containing line comprises graphene, the electrical resistivity of the at least one carbon-containing line can be lower than comparable conductive lines that do not comprise graphene by a factor exceeding five. Thus, as an example, where tungsten has electrical resistivity ranging between about 5 and 25 µOhm-cm, a carbon-containing line comprising graphene can have an electrical resistivity ranging between about 1 and 5 µOhm-cm.

It will be appreciated that in some embodiments of memory arrays, various embodiments of the upper conductive lines and the lower conductive lines described above with respect to FIGS. 2A, 2B, 6A, and 6B can be mixed and matched to have any of the structures and materials described above with respect to the at least one of the upper and lower conductive lines 50 and 52 of FIG. 2A, 54 and 56 of FIG. 2B, 150 and 152 of FIG. 6A, and 154 and 156 of FIG. 6B. For example, in some embodiments, at least one or both of the upper and lower conductive lines may comprise any one of: a metallic material and carbon (described above with respect to FIG. 2A), a metallic material without carbon (described above with respect to FIG. 2A), a stack of layers having a layer which includes a metallic material and carbon and a layer which includes a metallic material without carbon (described above with respect to FIG. 2B), a conductive carbon (e.g., graphene, described above with respect to FIG. 6A), or a stack of layers having a layer which includes conductive carbon (e.g., graphene) and a layer which includes a metallic material (described above with respect to FIG. 6B).

Figure 7A:
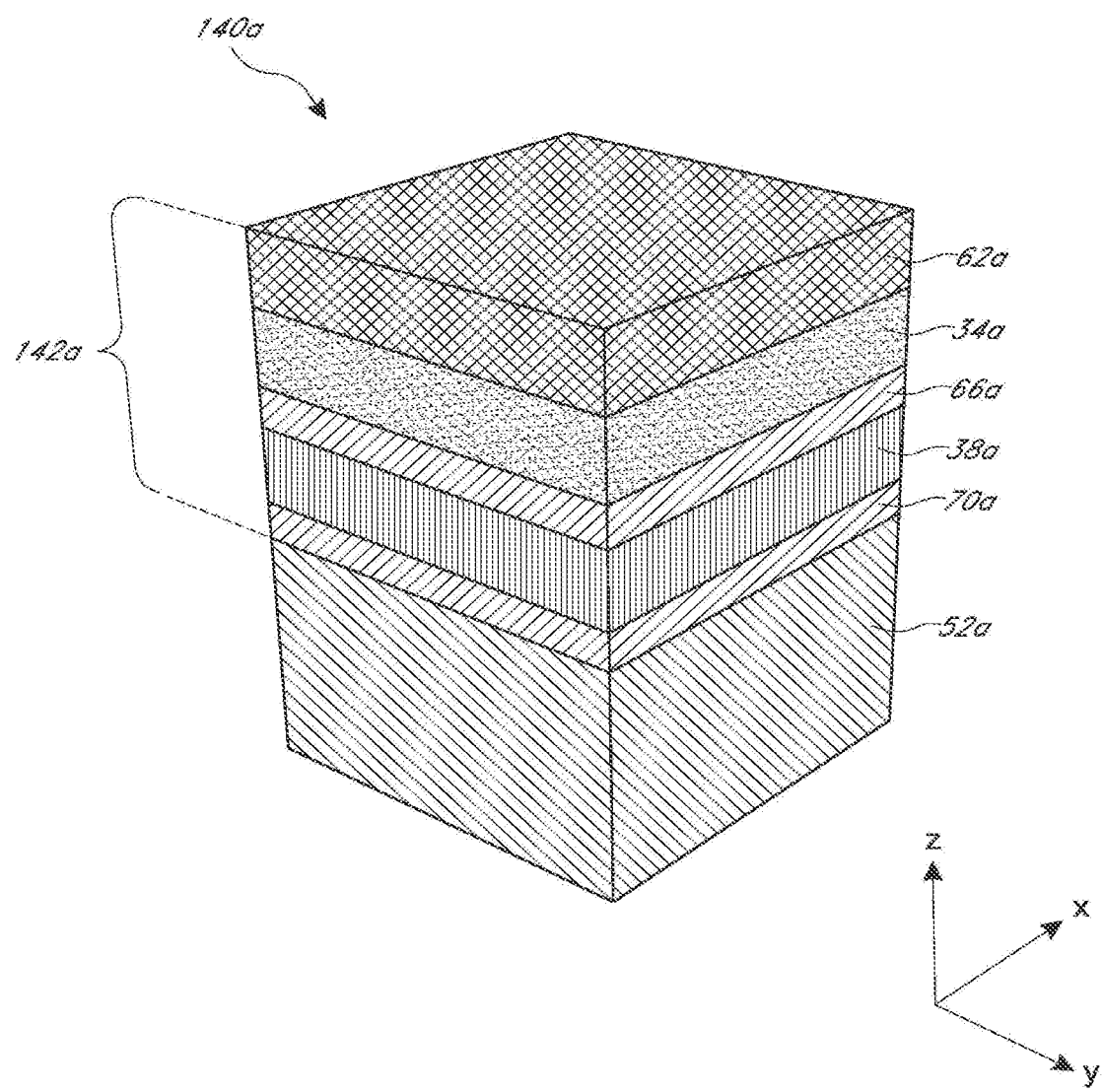
FIGS. 7A-7D illustrate three-dimensional isometric views of a portion of a memory array including conductive lines comprising a metal and carbon at various stages of fabrication according to some embodiments.
Figure 7B:
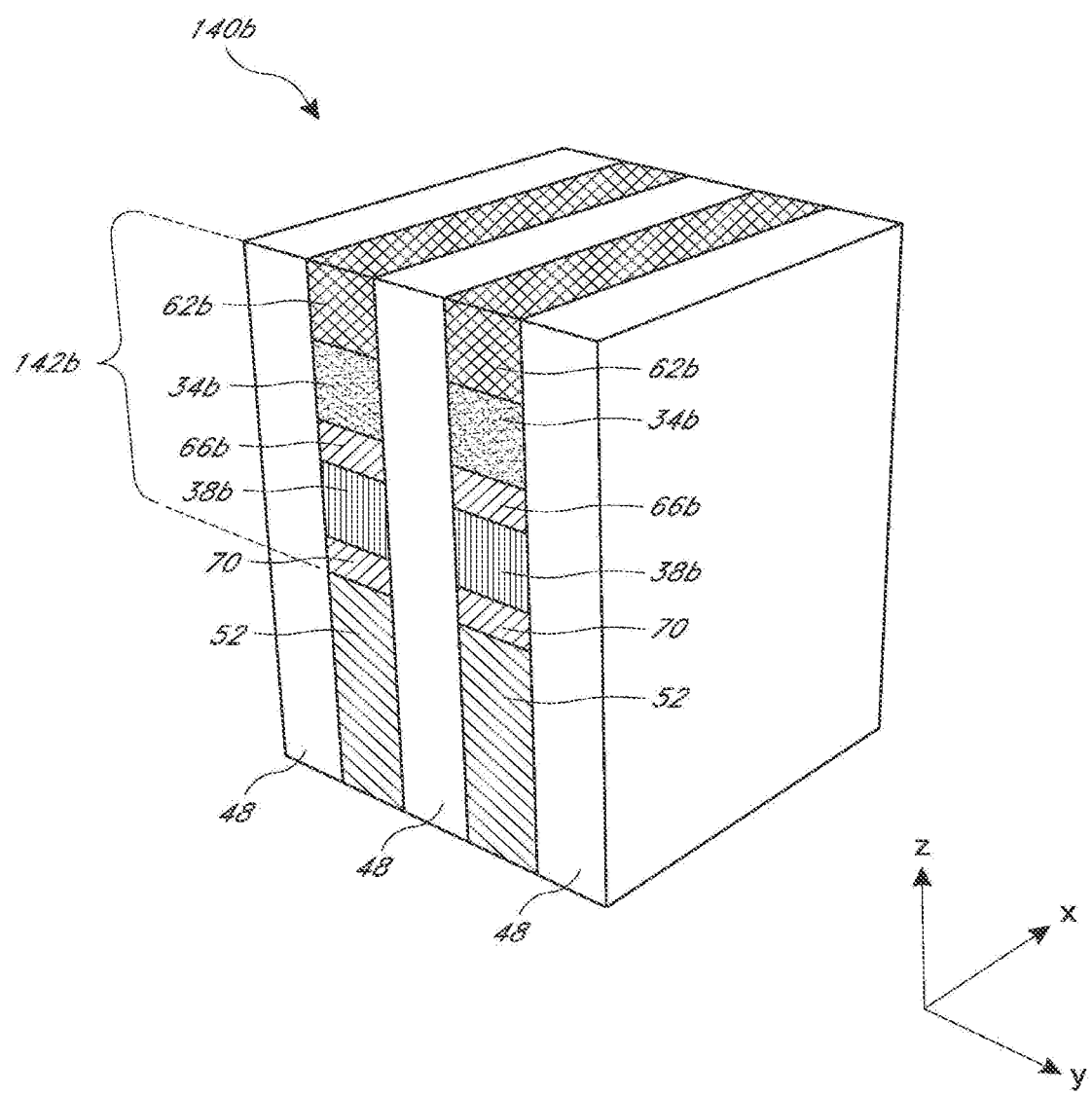
Figure 7C:
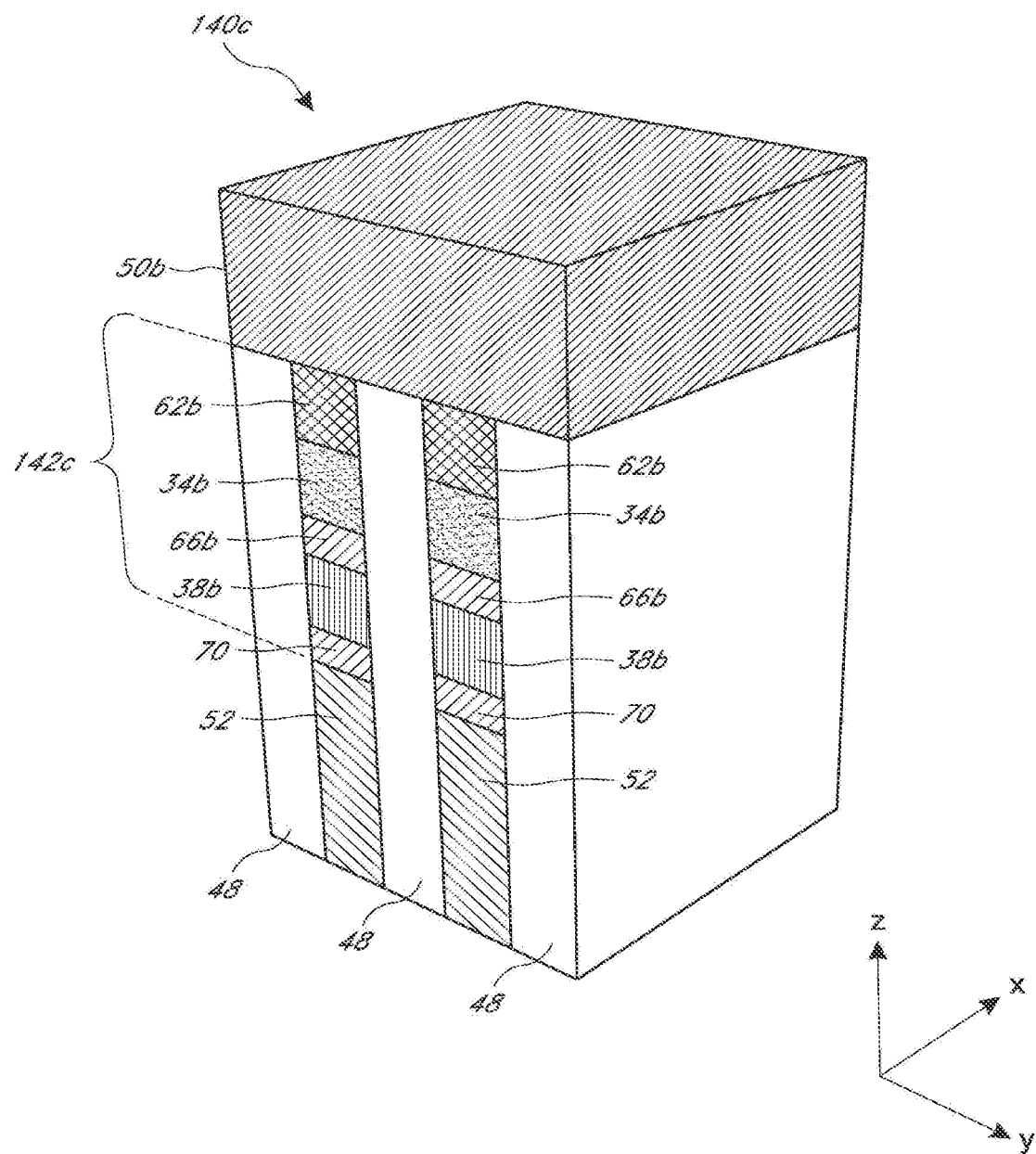
Figure 7D:
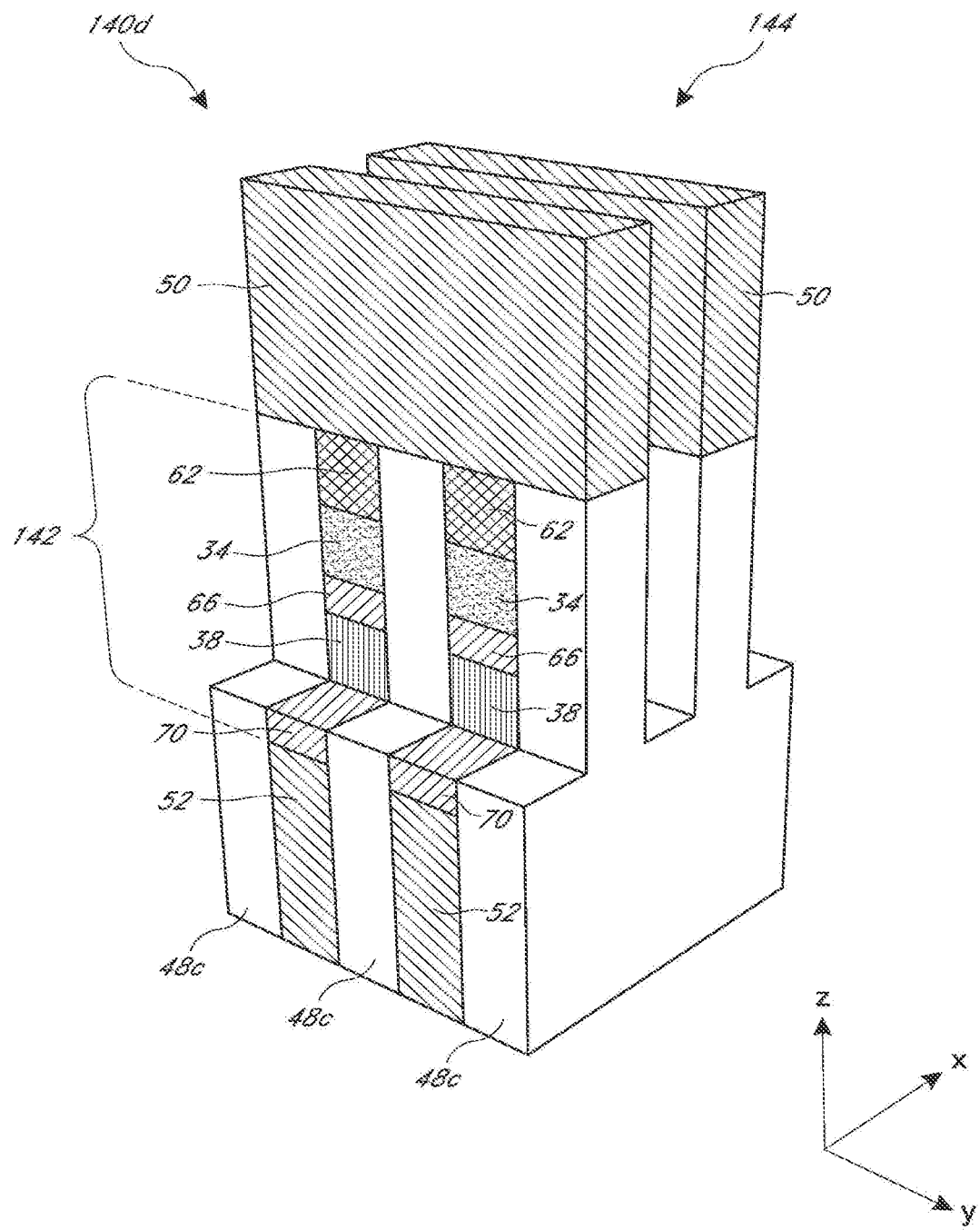

FIGS. 7A-7D are schematic three-dimensional depictions of intermediate memory array structures illustrating a method of fabricating a memory cell stack, depicted at various stages of fabrication according to some embodiments. The method includes providing a substrate and forming a lower conductive line 52 extending in a first direction by forming and patterning a lower conductive material 52a over the substrate (FIGS. 7A-7C). The method additionally includes forming and patterning a memory cell material stack 142 on the lower conductive line 52 (FIGS. 7B-7D). The method additionally includes forming an upper conductive line 50 extending in a second direction by forming and patterning an upper conductive material 50b over the lower conductive line (FIGS. 7C-7D). Furthermore, forming the memory cell stack 142 includes forming an electrode (62 and/or 70) interposed between the at least one of the upper and lower conductive lines (50 and/or 52) and the closer of the first and second active elements. Materials of the cell material stack, the conductive lines, and the electrodes comprise similar corresponding materials described above with respect to FIGS. 2A-2B, FIGS. 3-5, and FIGS. 6A-6B. In particular, at least one of the upper and lower conductive lines 50 and 52 can comprise carbon as described with respect to FIGS. 2A-2B and 6A-6B While not shown for clarity and ease of illustration, it will be understood that the illustrated array structures are formed over a substrate, which can include, among other things, a bulk semiconductor substrate as well as integrated structures formed thereover.

As used herein and throughout the specification, "subtractive patterning" refers to a process sequence where structures to be defined are patterned by the removal of material. For example, a "subtractive patterning process" may include first lithographically providing etch mask structures overlapping areas to be patterned, followed by etching, such that materials in areas covered by the mask structures are protected while materials in exposed areas are removed by the etch removal process.

In the following, only short segments of two upper conductive lines and two lower conductive lines and four memory cell stacks disposed therebetween at their intersections will be used to illustrate a method of fabricating a memory cell. The skilled artisan will appreciate, however, that in practice many parallel lines may be formed to span a memory array.

Referring to intermediate array structure 140a of FIG. 7A, according to some embodiments, the method of fabricating the memory cell includes forming a lower conductive material 52a over a substrate (not shown) and forming a memory cell material stack 142a over the lower conductive material 52a. In the illustrated embodiment, the memory cell material stack 142a includes a lower electrode material 70a on the lower conductive material 52a, a first active material, e.g., a selector element material 38a, on the lower electrode material 70a, a middle electrode material 66a on the selector element material 38a, a second active material, e.g., a storage element material 34a, on the middle electrode material 66a, and an upper electrode material 62a on the storage element material 34a. The foregoing features of the lower conductive material 52a and the memory cell material stack 142a may be formed, for example, by deposition techniques such as physical deposition (PVD), chemical vapor deposition (CVD), and atomic layer deposition (ALD), among other deposition techniques. Each feature may be initially formed as a blanket layer over an entire substrate, such as a silicon wafer.

Similar to material stacks described above with respect to the lower conductive lines 52 and 56 of FIGS. 2A and 2B, respectively, the lower conductive material 52a of FIG. 7A can include a metal, e.g., tungsten, and carbon. In these embodiments, the metal and carbon can be co-sputtered in a multi-target PVD chamber using a first target comprising the metal, e.g., tungsten, and a second target comprising carbon. In other embodiments, the metal and carbon can be co-sputtered in a single-target PVD chamber using a single target which comprises a mixture of the metal, e.g., tungsten, and carbon.

Also similar to material stacks described above with respect to the lower conductive lines 152 and 156 of FIGS. 6A and 6B, respectively, the lower conductive material 52a of FIG. 7A can include a stack comprising a metallic conductive material and a conductive carbon-containing material. In these embodiments, the metallic conductive material, e.g., a tungsten-containing metal, can be formed using a PVD process, followed by formation of the carbon-containing material, e.g., graphene-containing material, using a chemical vapor deposition process. Advantageously, in some embodiments, the carbon-containing material, which includes graphene, can be formed after forming the metallic conductive material having a surface adapted for growth of a relatively large single sheet of graphene, which can have an area exceeding about 100 nm×100 nm, exceeding about 500 nm×500 nm, or exceeding about 1 µm×1 µm. The graphene sheet can be formed, for example, across 200 mm Si wafers, 300 mm Si wafers, or 450 mm Si wafers.

In addition, as described with respect to FIG. 2B, any one or more of the lower electrode material 70a, the middle electrode material 66a on the selector element material 38a and the upper electrode material 62a can comprise amorphous carbon, or can comprise a metal, e.g., tungsten, and carbon, which may have similar or different atomic percentages of the metal and carbon compared to the lower conductive material 52a.

Referring to intermediate array structure 140b of FIG. 7B, according to some embodiments, the method of fabricating the memory cell includes subtractively patterning the memory cell material stack 142a and the lower conductive material 52a (FIG. 7A) to form a memory cell line stack 142b on a lower conductive line 52, both extending in the x-direction. In some embodiments, the memory cell line stack 142b and the lower conductive line 52 are patterned using a single mask and/or a single etch process, such as a dry reactive ion etch process in which different etch chemistries are employed as different materials are encountered, or a sputter etch. The cell line stack 142b includes a lower electrode line 70 on the lower conductive line 22, a selector element line 38b on the lower electrode line 70, a middle electrode line 66b on the selector element line 38b, a storage element line 34b on the middle electrode line 66b, and an upper electrode line 62b on the storage element line 34b.

As described above, any one of the lines of the cell line stack 142b can be omitted by omitting them from the blanket cell material stack 142a (FIG. 7A). For example, one or more of the upper lines, e.g., the storage element line 34b and/or the upper electrode line 62b can be omitted and can be deposited and patterned as lines extending in the y-direction at a later process (described more with respect to FIGS. 7C and 7D). In addition, one or more of the lower electrode line 70, the middle electrode line 66b and the upper electrode line 62b can be omitted.

Still referring to FIG. 7B, according to some embodiments, inter-line spaces between adjacent line stacks are filled with a dielectric material to form isolation dielectric regions 48. Suitable dielectric materials to fill the spaces can include, for example, silicon oxide and silicon nitride, which may be deposited by a suitable gap-filling process known in the art. Inclusion of carbon in the conductive lines 52 can reduce roughness and/or thickness and thus facilitate subsequent gapfill processes. Once the inter-line spaces between adjacent lower line stacks are filled with the dielectric material to form the isolation dielectric regions 48a, the intermediate array structure 140b can be chemical-mechanically polished to expose a substantially planar surface comprising alternating surfaces of the upper electrode line 62b interposed by isolation dielectric regions 48.

Referring to intermediate array structure 140c of FIG. 7C, according to some embodiments, the method of fabricating the memory cell stack additionally includes depositing an upper conductive material 50b on the substantially planar surface of FIG. 7B. The upper conductive material 50b can comprise substantially similar or same materials and can be formed using substantially similar or same processes as discussed above for forming the lower conductive material 52a of FIG. 7A, which can include a metal, e.g., tungsten, and carbon, or a stack comprising a metallic conductive material and a conductive carbon-containing material.

Referring to intermediate array structure 140d of FIG. 7D, according to some embodiments, the method of fabricating the memory cell additionally includes subtractively patterning to form a wall structure 144 extending in the y-direction. The wall structure 144 includes an upper conductive line 50 extending in a y direction and at least part of the memory cell stack 142. Thus, the memory cell line stack 142b of FIG. 7B is patterned into an isolated, e.g., pillar-shaped, memory cell stack 142. In the illustrated embodiment, the at least part of the memory cell stack 142 that is formed by subtractively patterning to form the wall structure 144 includes an upper electrode 62, a storage element 34, a middle electrode 66 and a selector element 38.

In the illustrated embodiment of FIG. 7D, etching is stopped after etching to form the selector element 38 such that the resulting cell stack 142 includes the upper electrode 62, the storage element 34, the middle electrode 66, the selector element 38, and the lower electrode line 70. However, the etching can be stopped after etching any layer of the wall structure such that any one of the cell stack component layers, e.g., the selector element 38 can form a line similar to the lower electrode line 70.

In some embodiments, where the lower conductive line 52 and/or the upper conductive 50 includes a conductive material that is at least partially amorphous, forming the lower conducive line 52 and/or the upper conductive lines 50 includes precipitating grains comprising at least one of alpha or beta phase tungsten and forming a matrix having a carbon content that is greater than a carbon content of the grains.

In embodiments where the storage element line 34b and/or the upper electrode line 62b are omitted from the memory cell stack 142b as described above with respect to FIGS. 7A and 7B, the storage element material 34a (FIG. 7A) and/or the upper electrode material 62a (FIG. 7A) can be deposited with upper conductive material 50c (FIG. 7C) and patterned thereafter to form lines extending in the y-direction. In addition, one or more of the lower electrode line 70, the middle electrode 66 and the upper electrode 62 can be omitted.

While various embodiments described herein have been described in the context of memory devices and methods of forming thereof, the inventive aspects are not so limited and can be applied in other contexts of integrated circuit (IC) devices and methods of forming thereof. In one example, an IC device may comprise a conductive line, e.g., a metallization line, for providing electrical connections between various discrete devices. Such conductive line can include tungsten and carbon. In addition, such conductive line may be at least partially amorphous. For example, a conductive line can have between about 0.5% and about 20% of carbon by atomic percentage. The conductive line has a surface roughness having a root mean square value less than about 2.5% of a thickness of the conductive line. In some embodiments, the conductive line comprises a stack of alternating layers comprising at least one metal line and at least one alloy line comprising tungsten and carbon, wherein the at least one alloy line may be at least partially amorphous. The conductive line can be formed using similar processes described above with respect to FIGS. 7A-7D.

In another example, an IC device may comprise a conductive line, e.g., a metallization line, which comprises a stack comprising a metallic conductive line and a conductive carbon-containing line, where the conducive carbon-containing line has an electrical resistivity in a direction of line extension that is lower than an electrical resistivity of amorphous carbon. The conductive carbon-containing line may comprise grapheme and/or the wherein the metallic conductive line may comprise tungsten. In some embodiments, the conductive line comprises a stack comprising alternating layers of the metallic conductive lines and the conductive carbon-containing lines. An aspect ratio of the conductive line may be less than about one. The conductive line can be formed using similar processes described above with respect to FIGS. 7A-7D Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method, comprising:
   forming a lower conductive line extending in a first direction by patterning a lower conductive material over a substrate;
   forming an upper conductive line extending in a second direction by patterning an upper conductive material over the lower conductive line;
   forming a memory cell between the lower conductive line and the upper conductive line, the memory cell including an active element, wherein the lower conductive line and the active element are patterned in the first direction using a first mask process, and the upper conductive line and the active element are patterned in the second direction using a second mask process, such that the active element is isolated in both first and second directions after forming the memory cell,
   wherein forming the lower conductive line, the upper conductive line, or both comprise forming a metal alloy having a structure including grains and a matrix portion, the matrix portion being at least partially amorphous, and
   wherein the matrix portion has a carbon concentration that is greater than a carbon concentration of the grains.

2. The method of claim 1, wherein the active element of the memory cell comprises a selector element or a storage element.

3. The method of claim 1, wherein:
   forming the lower conductive line, the upper conductive line, or both comprise depositing graphene.

4. The method of claim 1, wherein the active element comprises a chalcogenide material.

5. The method of claim 1, wherein the active element comprises:
   a selector element comprising a chalcogenide material that is nonvolatile at room temperature and refrains from undergoing a phase change.

6. The method of claim 1, wherein the active element comprises a selector element comprising an ovonic threshold switch (OTS).

7. The method of claim 1, wherein the active element comprises a selector element comprising a chalcogenide material having a chemical element that suppresses crystallization of the chalcogenide material.

8. The method of claim 7, wherein the chemical element comprises arsenic.

9. The method of claim 1, wherein forming the lower conductive line comprises:
forming a metal line material; and
forming the metal alloy over the metal line material.

10. The method of claim 1, wherein the lower conductive line, the upper conductive line, or both comprise graphene.

11. The method of claim 1, wherein forming the lower conductive line comprises:
forming the metal alloy over the substrate; and
forming a metal line material over the metal alloy.

12. The method of claim 1, wherein the memory cell further comprises a second active element between the active element and the upper conductive line, the second active element patterned in the first direction using the first mask process, and the second active element patterned in the second direction using the second mask process, such that the second active element is isolated in both the first and second directions after forming the memory cell.

13. The method of claim 12, wherein the second active element is a storage element.

14. The method of claim 13, wherein the storage element comprises a chalcogenide material capable of undergoing a phase change that is nonvolatile at room temperature.

15. The method of claim 1, wherein the grains comprise a crystalline phase of the metal alloy.

16. The method of claim 1, wherein the grains comprise alpha phase tungsten, beta phase tungsten, or both.

17. A method, comprising:
patterning, using a first mask process, a lower conductive material over a substrate to form a lower conductive line extending in a first direction;
patterning, using a second mask process, an upper conductive material over the lower conductive material to form an upper conductive line extending in a second direction;
patterning, using the first mask process, at least one active element of a memory cell in the first direction to form the at least one active element; and
patterning, using the second mask process, the at least one active element of the memory cell in the second direction to form the at least one active element, wherein patterning the at least one active element using the first mask process and the second mask process to form the at least one active element electrically isolates the memory cell in the first direction and the second direction,
wherein the lower conductive material, the upper conductive material, or both comprise a metal alloy having a structure including grains and a matrix portion, the matrix portion being at least partially amorphous, and
wherein the matrix portion has a carbon concentration that is greater than a carbon concentration of the grains.

18. The method of claim 17, wherein the grains comprise a crystalline phase of the metal alloy.

19. The method of claim 17, wherein the grains comprise alpha phase tungsten, beta phase tungsten, or both.

* * * * *